(12) United States Patent
Alger et al.

(10) Patent No.: US 6,992,899 B2
(45) Date of Patent: Jan. 31, 2006

(54) POWER DELIVERY APPARATUS, SYSTEMS, AND METHODS

(75) Inventors: William Alger, Portland, OR (US); Gary Long, Aloha, OR (US); Gary Brist, Yamhill, OR (US); Carlos Mejia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 320 days.

(21) Appl. No.: 10/394,841

(22) Filed: Mar. 21, 2003

(65) Prior Publication Data

US 2004/0184248 A1   Sep. 23, 2004

(51) Int. Cl.
*H05K 7/06* (2006.01)

(52) U.S. Cl. ............... 361/767; 361/768; 361/783; 174/260; 174/261; 174/262; 257/691

(58) Field of Classification Search ............... None
See application file for complete search history.

(56) References Cited

U.S. PATENT DOCUMENTS

| | | | |
|---|---|---|---|
| 6,091,608 A * | 7/2000 | Thaller et al. | 361/784 |
| 6,104,088 A | 8/2000 | Hatano et al. | 257/698 |
| 6,586,684 B2 * | 7/2003 | Frutschy et al. | 174/260 |
| 2002/0129974 A1 | 9/2002 | Smith et al. | 174/260 |
| 2003/0011062 A1 | 1/2003 | Watanabe | 257/697 |
| 2004/0100780 A1 * | 5/2004 | Stone et al. | 361/760 |

FOREIGN PATENT DOCUMENTS

WO   WO-03073250 A2   9/2003

* cited by examiner

*Primary Examiner*—John B. Vigushin
(74) *Attorney, Agent, or Firm*—Schwegman, Lundberg, Woessner & Kluth, P.A.

(57) ABSTRACT

An apparatus and system, as well as fabrication methods therefor, may include a conductor attached to a carrier to bridge a contact field defined by a circuit that can be mounted to a circuit board.

21 Claims, 5 Drawing Sheets

POWER DELIVERY APPARATUS, SYSTEMS, AND METHODS

TECHNICAL FIELD

The subject matter disclosed relates generally to apparatus, systems, and methods used to provide electric power to circuitry, including computers and processors.

BACKGROUND INFORMATION

Circuits, including processors, may be packaged to include an array of electrical contacts or package pads arranged in the form of a contact field having an inner perimeter and an outer perimeter. In some circuit packages, one or more power contacts are located inside the inner perimeter of the contact field.

When such packages are mounted to a circuit board, vias may be used as part of the electrical path from one or more circuit board power planes to the power contacts. However, as the package contact field connection density increases, and the array package pitch decreases, the available power plane connection area may be reduced. This reduction can be caused by the presence of antipads (i.e., clearance holes) introduced into the circuit board to accommodate various connection paths through the board. The planar area available to place connection traces may also be reduced due to the concentration of connection pads in the contact field.

As a result, the amount of power available to the circuit may also be reduced, contributing to power supply droop during peak power consumption periods. Moreover, vias used as a part of the power path may have a reduced cross-sectional area, increasing resistance and further reducing the power available to the circuit.

DETAILED DESCRIPTION

Figure 1A:
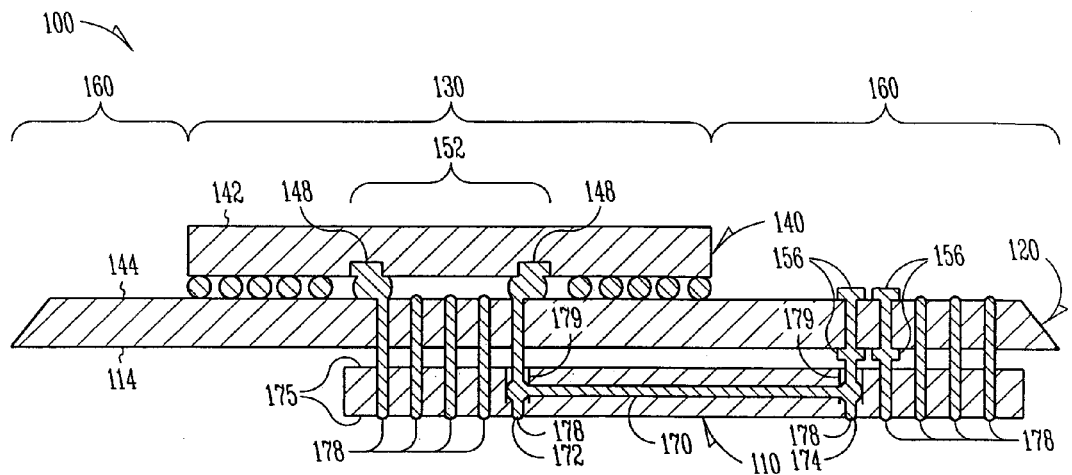
FIGS. 1A and 1B are side and bottom views, respectively, of an apparatus according to various embodiments of the invention.

In the following detailed description of various embodiments of the invention, reference is made to the accompanying drawings that form a part hereof, and in which are shown by way of illustration, and not of limitation, specific embodiments in which the subject matter may be practiced. In the drawings, like numerals describe substantially similar components throughout the several views. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. The following detailed description, therefore, is not to be taken in a limiting sense, and the scope of various embodiments of the invention is defined only by the appended claims, along with the full range of equivalents to which such claims are entitled.

Figure 1B:
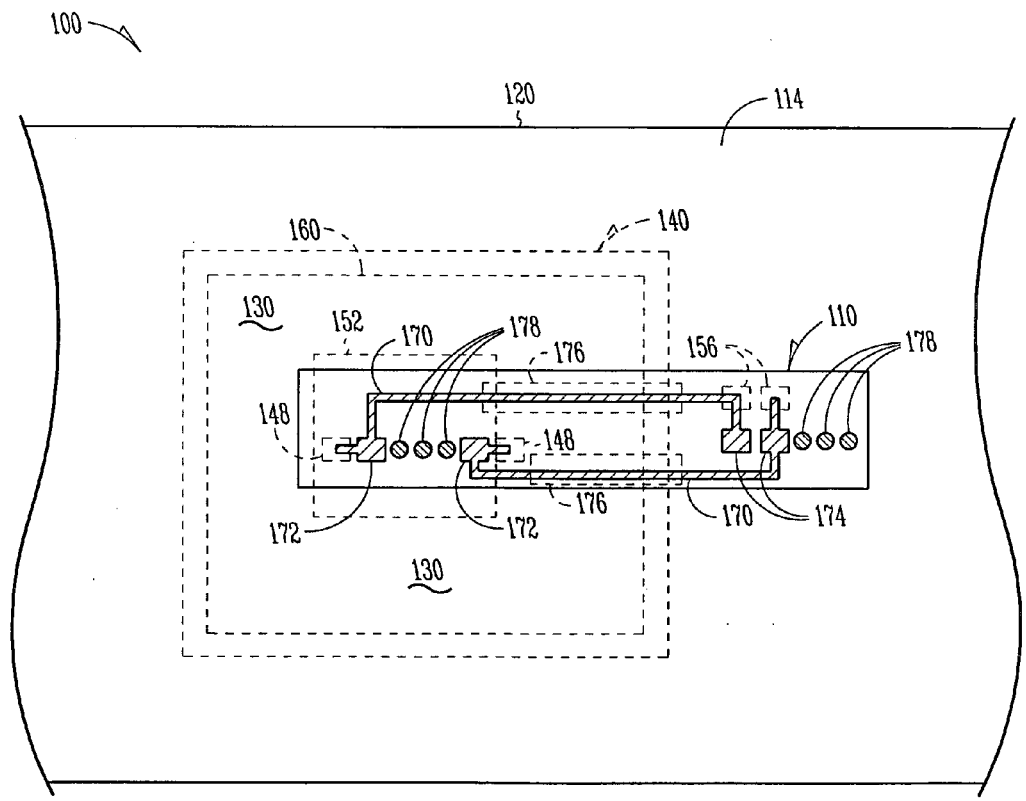

FIGS. 1A and 1B are side and bottom views, respectively, of an apparatus according to various embodiments of the invention. The apparatus 100 may comprise a carrier 110 which can be located adjacent a first side 114 of a circuit board 120. The circuit board 120 may have a contact field 130 defined therein by a circuit 140, which may be included in a package 142 and may be located on a second side 144 of the circuit board 120. The circuit 140 may include one or more power supply contacts 148, which may be located inside the inner perimeter 152 of the contact field 130. The circuit board 120 may include one or more power supply terminals 156 located outside of the outer perimeter 160 of the contact field 130.

One or more conductors 170 may be attached to the carrier 110. Selected ones of the conductors 170 may have a first terminal 172 to be coupled to one or more of the power supply contacts 148. Selected ones of the conductors 170 may also have a second terminal 174 to be coupled to one or more of the power supply terminals 156.

The carrier 110 may comprise any type(s) of materials, including a flexible material. The materials included in the carrier 110 may be non-conductive or conductive, and they may provide a supporting structure and/or insulating properties for one or more conductors 170, depending upon the configuration and requirements of the circuit 140 and package 142.

The conductors 170 can be located on a surface 175 of the carrier 110 and/or embedded within the carrier 110. Thus, the conductors 170 may be etched out of a conductive material attached to the carrier 110 or embedded in the carrier 110. For example, the carrier 110 could be fabricated from single-sided, double-sided, or multiple layers of FR4 (Fire Retardant Grade 4) circuit board material 120 with copper conductors 170, the conductor size and number depending upon the power requirements of the circuit 140. Other materials, including metalized organic and/or inorganic materials, flexible circuitry, and cable housing can also be used to fabricate the carrier 110. The conductors 170 may be used to conduct any form of energy included in the electromagnetic spectrum.

When provided in a non-conductive form, the carrier material may also provide insulation between individual conductors 170, as well as between conductors 170 and the contact field 130, which may be bridged by the carrier 110. For example, FR4 circuit board material can insulate an embedded conductor 170 from shorting to other conductors 170, and solder mask or other insulating material 176 can be applied to the surface 175 of the carrier 110 to prevent the conductors 170 from shorting to external items, such as traces on the circuit board 120, components mounted thereon, conductive elements within the contact field 130, (e.g., pads, etc.). Thus, an insulating material 176 may be used to cover a portion of one or more of the conductors 170.

The apparatus 100 may also include one or more pins 178 to couple the terminals 172 and the power supply contacts 148. The pins 178 may also be used to couple the terminals 174 to the power supply terminals 156. The pins 178 may be of any number and of any type or combination of types, including friction-fit pins. The pins 178 may be soldered into vias 179 included in the carrier 110. The pins 178 may also be molded into the carrier 110. Thus, several methods can be used to attach the pins 178 to the carrier 110, including for example, soldering, staking, insert molding, friction fit, conductive epoxy, etc.

Figure 2:
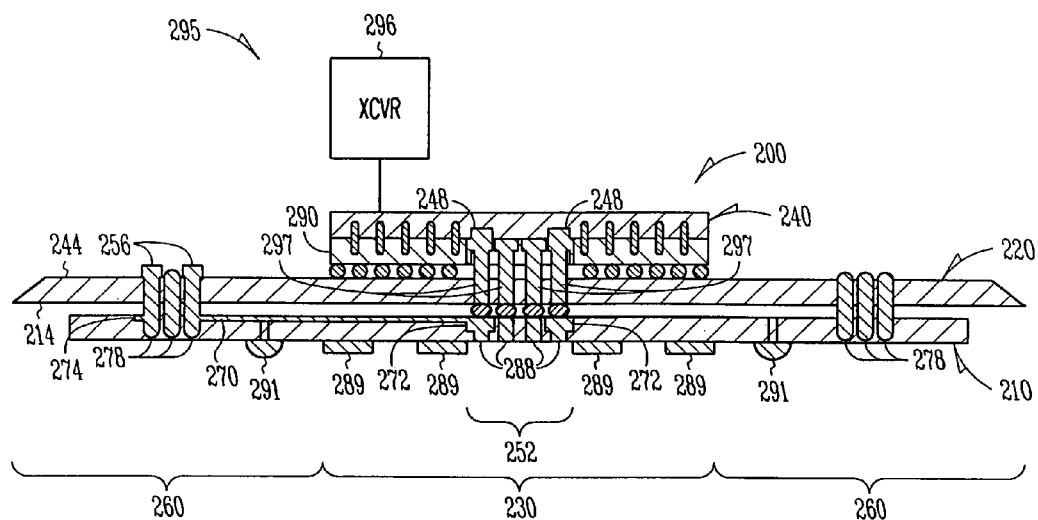
FIG. 2 is a side view of an apparatus and a system according to various embodiments of the invention.

FIG. 2 is a side view of an apparatus and a system according to various embodiments of the invention. As shown, the apparatus 200 and the carrier 210 may comprise one or more solid vias 288 to couple the terminals 272 and the power supply contacts 248. The apparatus 200 may also comprise one or more electrical power regulation components 289 to be attached to the carrier 210. In other embodiments, the apparatus 200 may comprise a socket 290 to be located adjacent the circuit 240 and the second side 244 of the circuit board 220.

Figure 3:
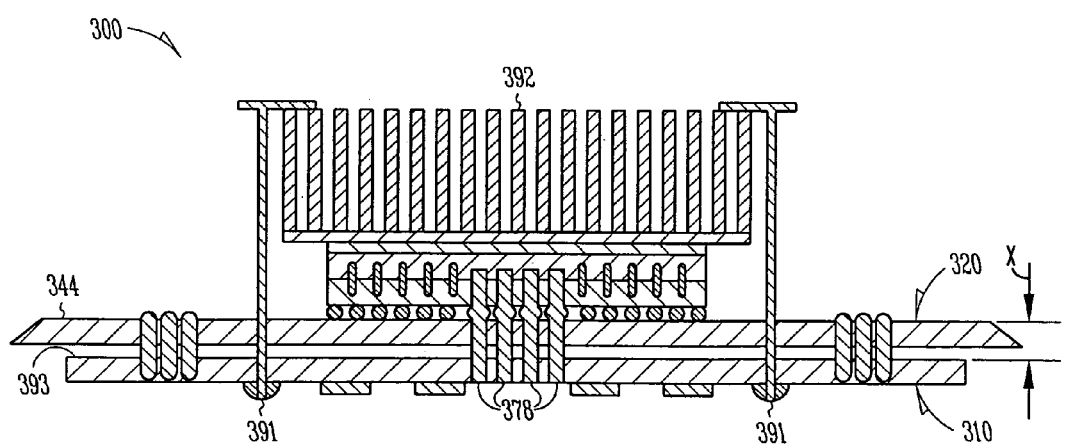
FIG. 3 is a side view of an apparatus according to various embodiments of the invention.

FIG. 3 is a side view of an apparatus according to various embodiments of the invention. For example, in some embodiments, the apparatus 300 and the carrier 310 may comprise a plurality of mechanical attachment points 391 to secure a heat sink 392. Thus, the apparatus 300 and the carrier 310 may provide additional stability to the heat sink 392 by acting as a stiffener for the circuit board 320.

Figure 4:
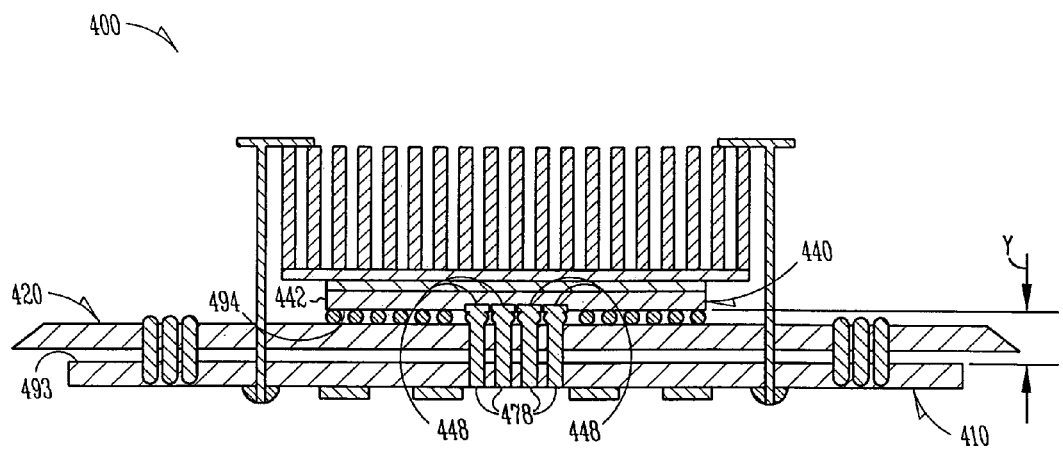
FIG. 4 is a side view of an apparatus according to various embodiments of the invention.
Figure 5:
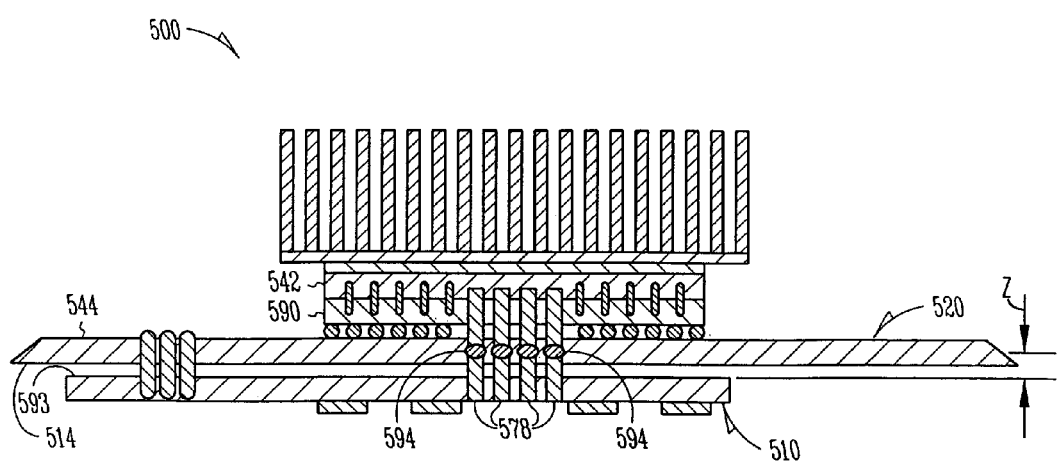
FIG. 5 is a side view of an apparatus according to various embodiments of the invention.

FIGS. 4 and 5 are side views of an apparatus according to various embodiments of the invention. Referring now to FIGS. 3–5, it can be seen that the length of the pins 378, 478, and 578 may be adjusted as desired by the architect of the apparatus 300, 400, and 500, respectively. For example, the apparatus 300 and carrier 310 may comprise pins 378 having a length sufficient to span a distance X (FIG. 3) from a top surface 393 of the carrier 310 to a second side 344 of the circuit board 320. The apparatus 400 and carrier 410 may also comprise pins 478 having a length sufficient to span a distance Y (FIG. 4) from a top surface 493 of the carrier 410 to an underside 494 of the package 442 including the circuit 440. In other embodiments, the apparatus 500 and carrier 510 may comprise pins 578 having a length sufficient to span a distance Z (FIG. 5) from a top surface 593 of the carrier 510 to a point 594 located between a first side 514 of the circuit board 520 and a second side 544 of the circuit board 520.

Referring now to FIGS. 1–5, it should be noted that the pins 178, 278, 378, 478, 578 may fabricated in any number of cross-sectional shapes, including round, square, rectangle, star, triangle, ellipse, etc. The pins 178, 278, 378, 478, 578 can be solid or hollow. The pins 178, 278, 378, 478, 578 can be constructed for a friction fit ("press fit") or a pass-through fit as they interface with holes or recesses in the carrier 110, 210, 310, 410, 510 and/or circuit board 120, 220, 320, 420, 520. Thus, the pins 178, 278, 378, 478, 578 attached to the carrier 110, 210, 310, 410, 510 may be inserted into vias, plated or non-plated (e.g., cavity, such as a drilled or punched hole), in the circuit board 120, 220, 320, 420, 520 and soldered to the board 120, 220, 320, 420, 520 and/or the contacts 148, 248, 448 included in the package 142, 242, 442. A conductive epoxy (or other adhesive, conductive material) can also be used to bond the pins 178, 278, 378, 478, 578 to the circuit board 120, 220, 320, 420, 520. Friction fit type pins 178, 278, 378, 478, 578 may not require soldering to the circuit board 120, 220, 320, 420, 520.

Among other types of connections, the terminals 172, 174 of the conductor 170 may be pads, vias, or plated-through-holes filled with a conductive material (not shown) forming a solid via 288. When solid vias 288 are used, the terminals 172, 174, 272, 274 can be soldered or bonded directly to corresponding contacts 148, 248 and terminals 156, 256.

Figure 6:
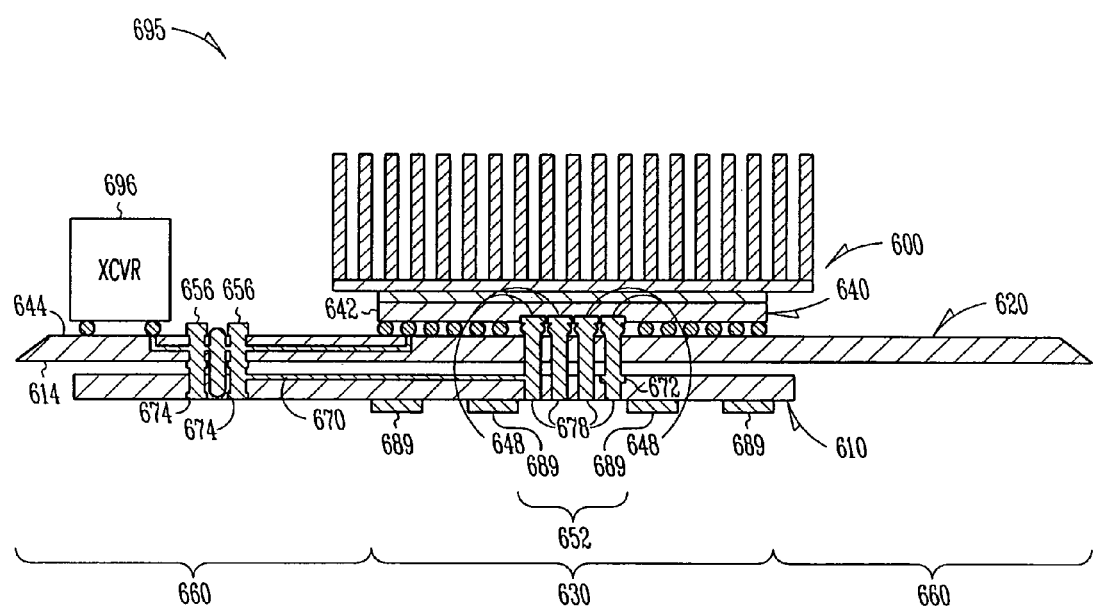
FIG. 6 is a side view of an apparatus and a system according to various embodiments of the invention.

FIG. 6 is a side view of an apparatus and a system according to various embodiments of the invention. Referring now to FIGS. 5–6, it can be seen that the apparatus 500, 600 can be attached to the circuit board 520, 620 by placing the pins 578, 678 into corresponding vias in the circuit board 520, 620. The pins 578, 678 may pass completely through the circuit board 520, 620, extending past the opposite side or stop flush with the opposite surface or below the surface of the printed circuit board 520, 620. The package 542, 642 may be soldered directly to the pins 578, 678 or soldered to an interface, such as a socket 590 that provides electrical connection to the package 542. The socket 590 may provide electrical connection to the contact field 630 and/or the power contacts 648.

Other embodiments of the invention may also be realized. For example, as shown in FIGS. 2 and 6, a system 295, 695 may comprise a wireless transceiver 296, 696 electrically coupled to a carrier 210, 610 and a processor 240, 640. The carrier 210, 610 may be located adjacent a first side 214, 614 of a circuit board 220, 620 having a contact field 230, 630. Thus, the processor 240, 640 may define the contact field 230, 630 in the circuit board 220, 620. The processor 240, 640 may be located on a second side 244, 644 of the circuit board 220, 620, and may include one or more power supply contacts 248, 648 located inside an inner perimeter 252, 652 of the contact field 230, 630. The system 295, 695 may also include one or more electrical power regulation components 289, 689 attached to the carrier 210, 610. As noted above, the circuit board 220, 620 may include one or more power supply terminals 256, 656 located outside an outer perimeter 260, 660 of the contact field 230, 630.

The system 295, 695 may also include one or more conductors 270, 670 attached to the carrier 210, 610. The conductors 270, 670 may have one or more terminals 272, 672 to couple to one or more of the power supply contacts 248, 648, and one or more terminals 274, 674 to couple one or more of the power supply terminals 256, 656.

As seen in FIG. 2, the system 295 may also include a socket 290 to be located adjacent the processor 240 and the second side 244 of the circuit board 220. The socket 290 may include one or more pins 297 located inside the inner perimeter 252 of the contact field 230 to couple the terminals 272 and the power supply contacts 248. The carrier 210 may include a plurality of mechanical attachment points 291 to secure a heat sink (not shown in FIG. 2).

The apparatus 100, 200, 300, 400, 500, 600, including the carrier 110, 210, 310, 410, 510, 610, circuit board 120, 220, 320, 420, 520, 620, contact field 130, 230, 630, circuit or processor 140, 240, 440, 640, package 142, 442, power supply contacts 148, 248, 648, power supply terminals 156, 256, 656, conductors 170, 270, 670, terminals 172, 174, 272, 274, 672, 674, insulating material 176, pins 178, 278, 378, 478, 578, solid vias 288, electrical power regulation components 289, 689, socket 290, mechanical attachment points 291, 391, heat sink 392, wireless transceiver 296, 696, and pins 297 may all be characterized as "modules" herein. Such modules may include hardware circuitry, and/or a processor and/or memory circuits, software program modules and objects, and/or firmware, and combinations thereof, as desired by the architect of the apparatus 100, 200, 300, 400, 500, 600 and the system 295, 695, and as appropriate for particular implementations of various embodiments of the invention. For example, such modules may be included in an operational simulation package, such as a software electrical signal simulation package, a power usage and distribution simulation package, and/or a power/heat dissipation simulation package, or a combination of software and hardware used to simulate potential circuit designs.

It should also be understood that the apparatus and systems of various embodiments of the invention can be used in applications other than for power delivery to processors, and other than for systems that include processors, and thus, embodiments of the invention are not to be so limited. The illustrations of an apparatus 100, 200, 300, 400, 500, 600 and a system 295, 695 are intended to provide a general understanding of the structure of various embodiments of the invention, and they are not intended to serve as a complete description of all the elements and features of apparatus and systems that might make use of the structures described herein.

Applications that may include the novel apparatus and systems of various embodiments of the invention include electronic circuitry used in high-speed computers, communication and signal processing circuitry, data transceivers, modems, processor modules, embedded processors, and application-specific modules, including multilayer, multichip modules. Such apparatus and systems may further be included as sub-components within a variety of electronic systems, such as televisions, cellular telephones, personal computers, workstations, radios, video players, vehicles, and others.

Figure 7:
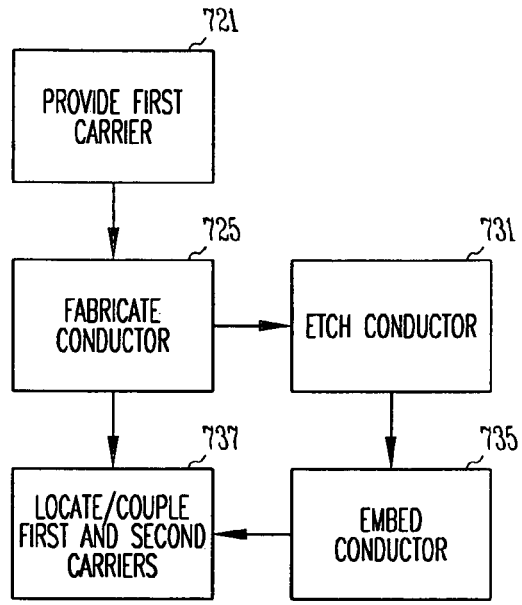
FIG. 7 is a flow chart illustrating several methods according to various embodiments of the invention.

Embodiments of the invention also include a number of methods. For example, FIG. 7 is a flow chart illustrating several methods according to various embodiments of the invention. The method 711 may begin with providing a first carrier to be located adjacent a first side of a second carrier (e.g., a circuit board) having a contact field defined therein by a circuit to be located on a second side of the second carrier at block 721. The circuit may include one or more power supply contacts to be located inside an inner perimeter of the contact field, and the second carrier may include one or more power supply terminals to be located outside an outer perimeter of the contact field. The method 711 may continue with fabricating a conductor attached to the first carrier at block 725. The conductor may have one or more terminals to couple to the power supply contacts, and one or more other terminals to couple to the power supply terminals. Fabricating a conductor at block 725 may include etching the conductor out of a conductive material attached to the first carrier at block 731, and/or embedding the conductor in the first carrier at block 735.

The method 711 may include locating the first carrier adjacent the second carrier, including adjacent the first side of the second carrier at block 737. The method 711 may also include coupling a first terminal of the conductor to one or more of the power supply contacts, and coupling a second terminal of the conductor to one or more of the power supply terminals at block 737.

It should be noted that the methods described herein do not have to be executed in the order described, or in any particular order. Moreover, various activities described with respect to the methods identified herein can be executed in serial or parallel fashion.

Figure 8:
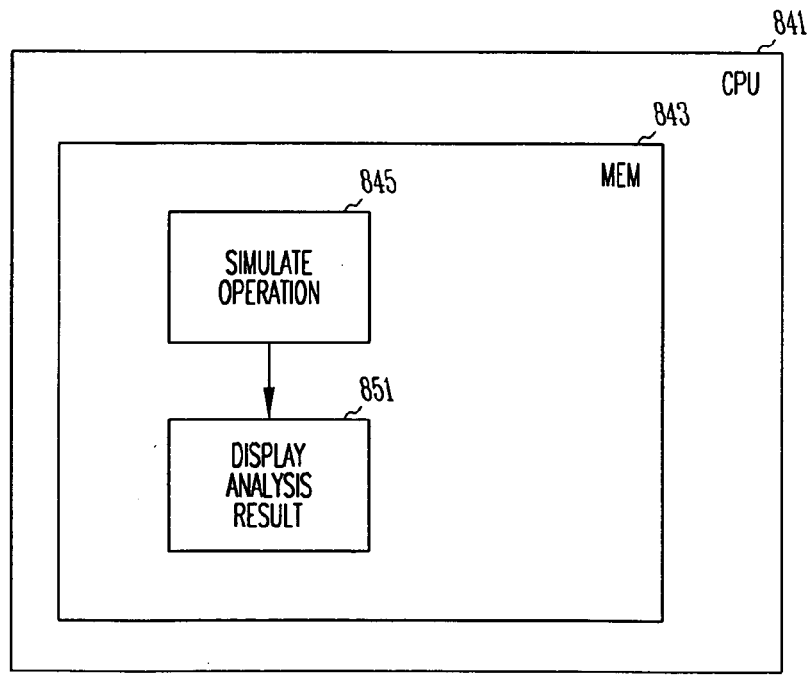
FIG. 8 is a block diagram of an article according to various embodiments of the invention.

FIG. 8 is a block diagram of an article according to various embodiments of the invention. Thus, another embodiment of the invention may include an article 841, such as a computer, a memory system, a magnetic or optical disk, some other storage device, and/or any type of electronic device or system, comprising a machine-accessible medium such as a memory 843 (e.g., a memory including an electrical, optical, or electromagnetic conductor) having associated data 845, 851 (e.g., computer program instructions), which when accessed, results in a machine performing such actions as simulating the operations of a circuit operating at a selected clock frequency coupled to a selected power supply. Further actions may include displaying a result of the simulation using a human-perceivable medium, such as a video display, or hardcopy printout. The circuit may be associated with a carrier to be located adjacent a first side of a circuit board having a contact field defined therein by the circuit, which is to be located on a second side of the circuit board. The circuit, which may be a processor, may include one or more power supply contacts to be located inside an inner perimeter of the contact field, and the circuit board may include one or more power supply terminals to be located outside an outer perimeter of the contact field. One or more conductors may be attached to the carrier, and any one or more of the conductors may have one or more terminals to couple to the power supply contacts, and one or more terminals to couple to the power supply terminals.

The circuit may be a processor included in a package. The result of the simulation may include an analysis of power supply signal propagation through one or more of the power supply contacts. Similarly, the result of the simulation may include an analysis of power supply signal propagation through one or more of the power supply terminals.

Although specific embodiments have been illustrated and described herein, it should be appreciated that any arrangement calculated to achieve the same purpose may be substituted for the specific embodiments shown. This disclosure is intended to cover any and all adaptations or variations of various embodiments of the invention. It is to be understood that the above description has been made in an illustrative fashion, and not a restrictive one. Combinations of the above embodiments, and other embodiments not specifically described herein will be apparent to those of skill in the art upon reviewing the above description.

The scope of various embodiments of the invention includes any other applications in which the above structures and methods are used. Therefore, the scope of various embodiments of the invention should be determined with reference to the appended claims, along with the full range of equivalents to which such claims are entitled.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. An apparatus, comprising:
    a carrier to be located adjacent a first side of a circuit board having a contact field defined therein by a circuit to be located on a second side of the circuit board, wherein the circuit includes a power supply contact located inside an inner perimeter of the contact field, and wherein the circuit board includes a power supply terminal located outside an outer perimeter of the contact field; and a conductor attached to the carrier, the conductor having a first terminal to couple to the power supply contact and a second terminal to couple to the power supply terminal.

2. The apparatus of claim 1, wherein the carrier comprises a flexible material.

3. The apparatus of claim 1, wherein the conductor is embedded in the carrier.

4. The apparatus of claim 1, wherein an insulating material covers a portion of the conductor.

5. The apparatus of claim 1, further comprising:
a plurality of conductors attached to the carrier, wherein at least one of the plurality of conductors includes a third terminal to couple to another power supply contact of the circuit, and a fourth terminal to couple to another power supply terminal of the circuit board.

6. The apparatus of claim 1, further comprising:
a pin to couple the first terminal and the power supply contact.

7. The apparatus of claim 6, wherein the pin is a friction-fit pin.

8. The apparatus of claim 6, wherein the pin is molded into the carrier.

9. The apparatus of claim 6, wherein the pin is soldered to the carrier.

10. The apparatus of claim 6, wherein the pin has a length sufficient to span a distance from a top surface of the carrier to the second side of the circuit board.

11. The apparatus of claim 6, wherein the pin has a length sufficient to span a distance from a top surface of the carrier to an underside of a package including the circuit.

12. The apparatus of claim 6, wherein the pin has a length sufficient to span a distance from a top surface of the carrier to a point located between the first side of the circuit board and the second side of the circuit board.

13. The apparatus of claim 1, wherein the carrier further comprises a via to couple the first terminal and the power supply contact.

14. The apparatus of claim 1, wherein the carrier further comprises:
a plurality of attachment points to secure a heat sink.

15. The apparatus of claim 1, further comprising:
an electrical power regulation component coupled to the carrier.

16. The apparatus of claim 1, further comprising:
a socket to be located adjacent the circuit and the second side of the circuit board.

17. A system, comprising:
a wireless transceiver;
a carrier located adjacent a first side of a circuit board having a contact field defined therein by a processor located on a second side of the circuit board, wherein the processor includes a power supply contact located inside an inner perimeter of the contact field, wherein the processor is electrically coupled to the wireless transceiver, and wherein the circuit board includes a power supply terminal located outside an outer perimeter of the contact field; and
a conductor attached to the carrier, the conductor having a first terminal to couple to the power supply contact, and a second terminal to couple to the power supply terminal.

18. The system of claim 17, further comprising:
a socket located adjacent the processor and the second side of the circuit board.

19. The system of claim 18, wherein the socket includes a pin located inside an inner perimeter of the contact field to couple the first terminal and the power supply contact.

20. The system of claim 17, wherein the carrier further comprises:
a plurality of mechanical attachment points to secure a heat sink.

21. The system of claim 17, further comprising:
an electrical power regulation component attached to the carrier.

* * * * *